(12) United States Patent
Bovington et al.

(10) Patent No.: US 11,081,856 B2
(45) Date of Patent: Aug. 3, 2021

(54) III-V LASER PLATFORMS ON SILICON WITH THROUGH SILICON VIAS BY WAFER SCALE BONDING

(71) Applicant: Cisco Technology, Inc., San Jose, CA (US)

(72) Inventors: Jock T. Bovington, La Mesa, CA (US); Vipulkumar K. Patel, Breinigsville, PA (US); Dominic F. Siriani, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 167 days.

(21) Appl. No.: 16/234,105

(22) Filed: Dec. 27, 2018

(65) Prior Publication Data

US 2020/0212649 A1 Jul. 2, 2020

(51) Int. Cl.

| | |
|---|---|
| *H01S 5/02* | (2006.01) |
| *H01S 5/042* | (2006.01) |
| *H01S 5/343* | (2006.01) |
| *H01S 5/40* | (2006.01) |
| *H01S 5/34* | (2006.01) |
| *G02B 6/42* | (2006.01) |

(52) U.S. Cl.
CPC ............ *H01S 5/0215* (2013.01); *H01S 5/021* (2013.01); *H01S 5/0218* (2013.01); *H01S 5/042* (2013.01); *H01S 5/343* (2013.01); *H01S 5/3412* (2013.01); *H01S 5/4025* (2013.01); *G02B 6/42* (2013.01); *G02B 6/4234* (2013.01)

(58) Field of Classification Search
CPC ...... H01S 5/021; H01S 5/0215; H01S 5/0218; H01S 5/343
See application file for complete search history.

(56) References Cited

U.S. PATENT DOCUMENTS

| | | |
|---|---|---|
| 6,455,337 B1 | 9/2002 | Sverdlov |
| 6,455,398 B1 | 9/2002 | Fonstad, Jr. et al. |
| 2009/0052490 A1* | 2/2009 | Maeda .................. H01S 5/187 372/50.11 |
| 2013/0215921 A1 | 8/2013 | Cohen et al. |
| 2018/0045882 A1* | 2/2018 | Chojnacki ........... H01S 5/02244 |
| 2018/0323575 A1* | 11/2018 | Caer ................... H01S 5/02484 |
| 2019/0227232 A1* | 7/2019 | Venkatesan ........... G02B 6/423 |

* cited by examiner

*Primary Examiner* — Michael Carter
(74) *Attorney, Agent, or Firm* — Patterson + Sheridan, LLP (57) ABSTRACT

A laser integrated photonic platform to allow for independent fabrication and development of laser systems in silicon photonics. The photonic platform includes a silicon substrate with an upper surface, one or more through silicon vias (TSVs) defined through the silicon substrate, and passive alignment features in the substrate. The photonic platform includes a silicon substrate wafer with through silicon vias (TSVs) defined through the silicon substrate, and passive alignment features in the substrate for mating the photonic platform to a photonics integrated circuit. The photonic platform also includes a III-V semiconductor material structure wafer, where the III-V wafer is bonded to the upper surface of the silicon substrate and includes at least one active layer forming a light source for the photonic platform.

16 Claims, 8 Drawing Sheets

III-V LASER PLATFORMS ON SILICON WITH THROUGH SILICON VIAS BY WAFER SCALE BONDING

TECHNICAL FIELD

Embodiments presented in this disclosure generally relate to lasers including III-V semiconductor material and the fabrication thereof.

BACKGROUND

The cost of production and the physical properties of lasers are influenced by the materials and methods used in producing those lasers. The choices made in the production methods and construction materials not only affect the yield for a given batch of lasers, but also affect the size of the batches. As a result, lasers are often produced on specialized equipment and in smaller batches than other electrical or optical components. Additionally, due to material differences in the laser from the other components, special techniques and materials are often used to integrate the lasers with other electrical or optical components to create a final assembly, which the other components do not require to integrate with one another, further adding to the costs of production.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure includes a wafer that includes a silicon substrate with an upper surface and one or more through silicon vias (tsvs) defined through the silicon substrate. The wafer also includes a III-V semiconductor material structure bonded to the upper surface of the silicon substrate including at least one active layer independently grown on the structure prior to bonding, where the at least one active layer forms a laser.

Another embodiment presented in this disclosure includes a photonic platform that includes a silicon substrate including an upper surface, one or more through silicon vias (tsvs) defined through the silicon substrate, and passive alignment features in the substrate. The photonic platform also includes a III-V semiconductor material structure bonded to the upper surface of the silicon substrate including at least one active layer independently grown on the structure prior to bonding, where the at least one active layer forms the laser for the photonic platform.

Another embodiment presented in this disclosure includes a method that includes independently forming a silicon substrate including a bonding layer on an upper surface; independently forming a III-V semiconductor material structure including a grown active layer; bonding the III-V semiconductor material structure to the bonding layer on the upper surface of the substrate to create bonded structure; and forming a photonic platform in the bonded structure.

EXAMPLE EMBODIMENTS

As described above, in the production and fabrication of silicon photonic integrated circuits (PICs), the various fabrication processes have been abstracted out so that various components can evolve and develop separately and so that various manufacturing/fabrication processes can be implemented at different phases of the manufacturing process without interfering with process of the other phases. For example, in some methods the production and development of electronic integrated circuits (EICs) has been decoupled from the production and development of PICs. This allows the PIC and EIC of various silicon PICs to evolve separately to ease development and manufacturing complications. The separation of the fabrication processes also allows for a faster time to market as technologies in each of the PIC and EIC improve.

There are also additional developments that further component decoupling can improve. For example, the laser of the silicon photonic IC, which is a critical component of the PIC, can be decoupled and developed separately from the modulation, detection, and multiplexing functions of the PIC. However, it is often important to maintain a precise integration of the laser and PIC, and for the PIC to maintain a precise integration to the EIC. Previous III-V laser fabrication processes were completed entirely on native III-V substrates which must then be bonded to partially processed silicon-on-insulator (SOI) chips including the heterogeneous III-V substrate platforms.

The methods and photonics/laser platform described herein enable independent fabrication of a laser platform with a low thermal impedance while also providing for precise laser and PIC integration. In some examples, portions of the laser platform, including a substrate, are independently made of silicon (Si) apart from an epitaxial growth process of III-V material, such that the growth processes does not add any additional stress to bonding interfaces between the III-V material and a silicon substrate and to leverage features such as through silicon vias (TSVs) in the substrate of the laser platform and low thermal impedance bonds. Furthermore, economies of scale can be leveraged by fabricating the laser platforms at a Si wafer scale.

A completed laser platform describe herein can provide butt coupling of the independently developed laser platform and the independently develop PIC by directly attaching a laser platform holding the laser to the PIC in a carefully aligned manner using mechanical alignment features described herein. For example, an end facet of a laser platform may be coupled with an end facet of a PIC to provide a broadband solution that is designed with low back reflection. An example laser platform is discussed in relation to FIG. 1 and the fabrication of the laser platform is discussed in relation to FIGS. 2A-2K.

Figure 1:
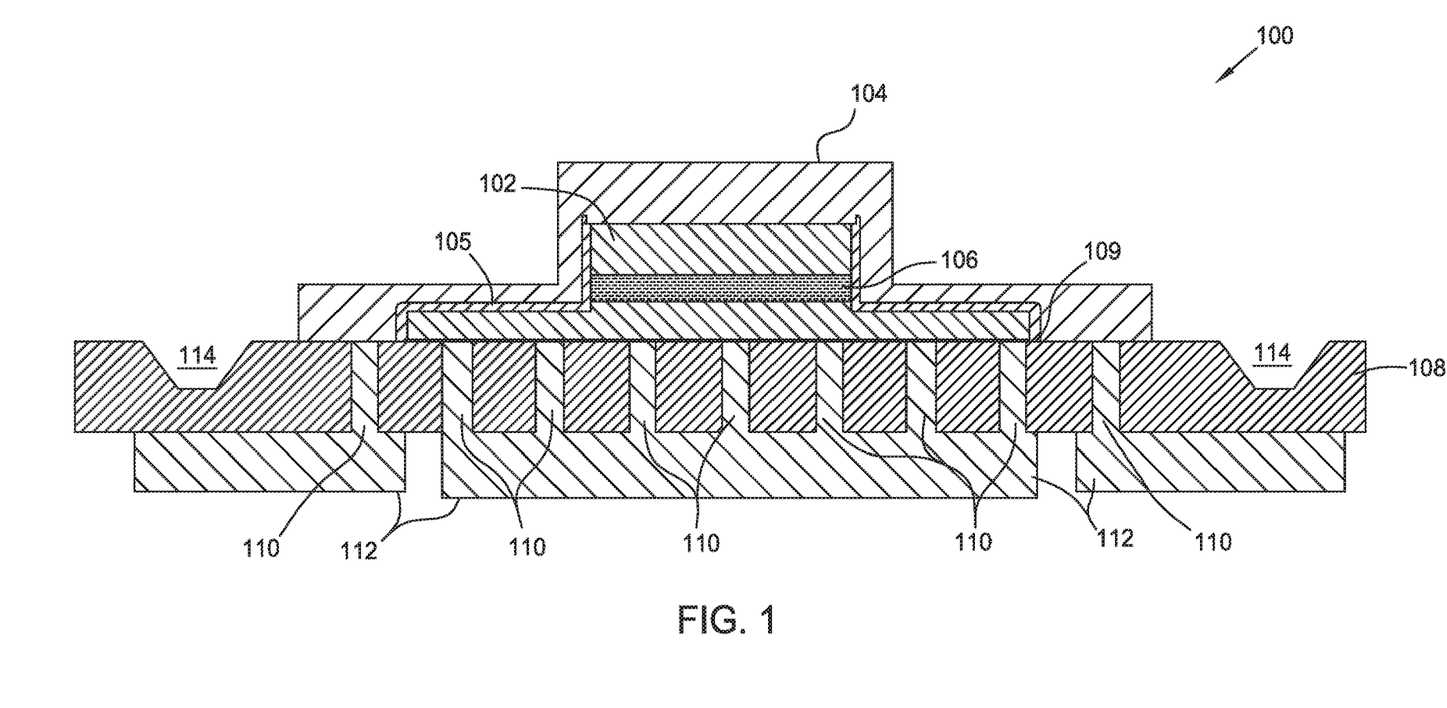
FIG. 1 illustrates a frontal cut-away view of a laser platform according to embodiments described herein.

FIG. 1 illustrates a frontal cut-away view of a laser platform 100 according to embodiments described herein. The laser integrated photonic platform, laser platform 100, includes a substrate 108. In some examples, the substrate is a Si substrate fabricated separately and/or independently from one or more other components of the laser platform 100. As shown, the substrate 108 includes one or more TSVs 110 defined through the substrate 108. In some examples, the TSVs 110 are formed in the substrate 108 prior to the substrate being bonded/coupled to other components in the substrate. In some examples, the TSVs 110 are formed in the substrate 108 subsequent to the substrate being bonded/coupled to other components in the substrate, as described herein. In some examples, the TSVs 110 include gold (Au) and/or copper (Cu) TSVs. In some examples, the substrate 108 includes an upper surface 109, which functions as an end facet for a coupling between the substrate 108 and other components of the laser platform, such as a III-V semiconductor material structure 102 described next.

As shown, the III-V semiconductor material structure 102 is bonded to the substrate 108 and the upper surface 109. In some examples, the structure 102 is independently formed/grown separately from other components of the laser platform 100, such as the substrate 108. This includes the formation/growth of an active layer 106 in the structure 102. The active layer 106 includes one or more layers to form a laser. In one example, the active layer 106 includes active layers forming quantum wells (QW) making the laser platform 100 a QW laser. In another example, the active layer 106 includes active layers forming quantum dots (QD), making the laser platform 100 a QD laser. Quantum Wells are two-dimensional structures formed by a thin layer of a first material surrounded by wider-bandgap material and that allow electronic capture in one dimension (allowing planar two-dimensional movement). Quantum Dots can act as zero-dimensional entities, which enables three-dimensional capture of excited electrons (not allowing movement). When sufficient voltage is applied across the active layer 106, a current flows through the active layer 106 and emits a laser from the laser platform 100 forming a light source.

As also shown in FIG. 1, the laser platform 100 includes a passivation/isolation boundary 105 which provides a protection and insulation barrier between the structure 102 and a top metal layer 104 and other environmental factors that may lead to degradation of the structure 102 and active layer 106. The laser platform 100 also includes a bottom metal layer 112. In some examples, the metal layers 104 and 112 are applied through metallization as described in more detail in relation to FIG. 2H-I. In some examples, the metallization step forms the TSVs 110 after the structure 102 is bonded to the substrate 108. The metal layers 104 and 112 may also include electrical leads for the laser platform 100, where the electrical leads are positioned such that other components can be physically attached to and/or electrically connected to the laser platform 100. The other components such as other PIC components and/or other EIC components may also be connected/coupled/joined to the laser platform 100 using the mechanical features 114.

In some examples, the mechanical features 114 include lithographic alignment features that can be mated and/or interlocked with one or more silicon photonic components, providing a sub-micron level passive alignment feature. For example, the alignment features may be used to align and mate optical waveguides in the laser platform 100 to other waveguides such as an input waveguide in a PIC, during coupling of the laser platform 100 to the PIC. In this example, the waveguides typically require a highly precise alignment (e.g., alignment within 1 micron). In some examples, the mechanical features including passive alignment features such as v-grooves, u-grooves, etc. In some examples, the mechanical features 114 are formed in the substrate after the structure 102 and the substrate 108 are bonded.

As shown, the laser platform 100 include components that are able to be fabricated independently of the PIC and the EIC, such that the laser platform can be developed independent of the other components of silicon photonics chip. Various methods to fabricate the laser platform will now be discussed in relation to FIGS. 2A-K and FIGS. 3A-B.

Figure 2A:
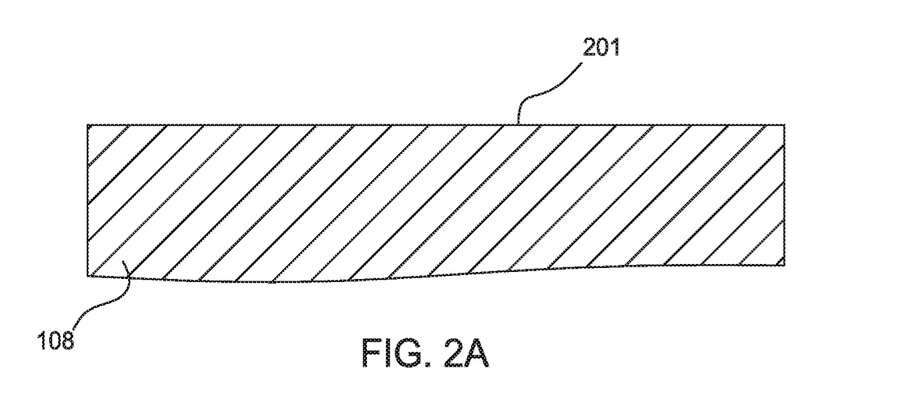
FIGS. 2A-K illustrate various views of the fabrication of a laser platform according to embodiments described herein.
Figure 2B:
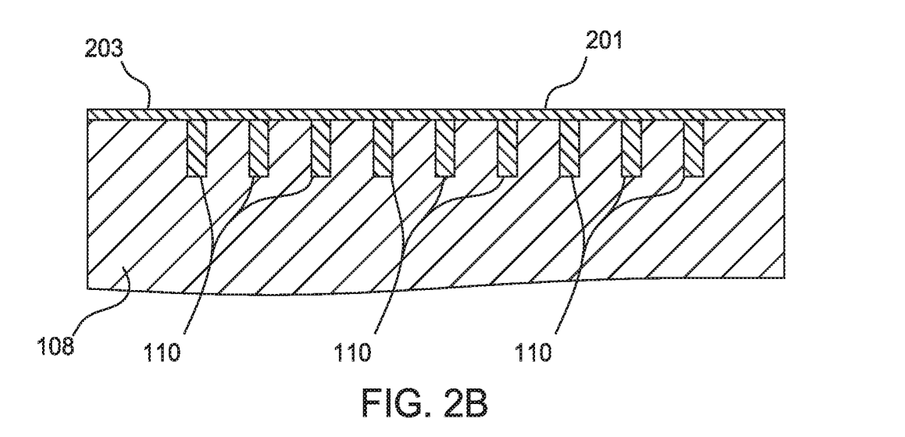
Figure 3A:
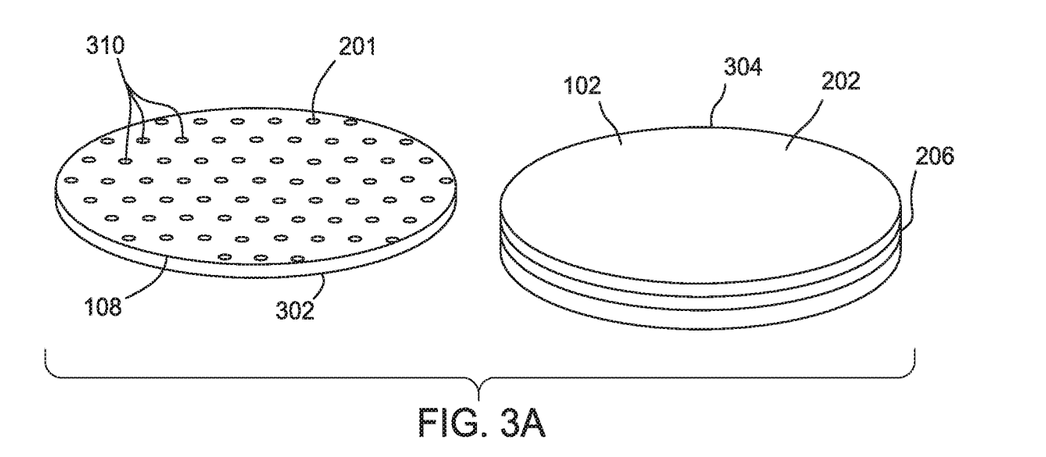
FIGS. 3A-C illustrate various views of the fabrication of a laser platform at a wafer level according to embodiments described herein.

FIGS. 2A-K illustrate various views of the fabrication of a laser platform, such as laser platform 100, according to embodiments described herein. FIG. 2A-B illustrates a first independent state of fabrication where a substrate 108 is formed. In some examples, the substrate 108 is a bulk substrate of a first wafer, wafer 302 shown in FIG. 3A. As shown in FIG. 3A, the wafer 302 includes TSVs 310. In some examples, the wafer 302 may comprise a 200 mm×300 mm wafer. In some examples, the substrate 108 (and the wafer 302) is a Si substrate. As shown in FIG. 2A, the substrate 108 includes an upper surface 201. In some examples, as shown in FIG. 2B, the substrate goes through a front end (prior to bonding) metallization process to form one or more TSVs 110 in the substrate 108.

In some examples, a bonding layer 203 is a formed on the upper surface 201 to enable a planar bonding surface. In some examples, the bonding layer 203 includes a deposited metallic bonding surface deposited on the substrate 108 and the upper surface 201. In some examples, the deposited metallic bonding surface enables a conductive bonding between the substrate 108 and the III-V semiconductor material structure 102. In some examples, the bonding layer 203 is a degenerately doped bonding surface, including silicon and/or silicon dioxide. In some examples, the degenerately doped bonding surface provides a conductive bonding between the silicon substrate 108 and the III-V semiconductor material structure 102. In another example, the bonding layer 203 is a doped surface on the substrate. For example, the upper surface 201 may be doped such as that the doped upper surface 201 forms the bonding layer 203. In every embodiment, the bonding layer 203 allows for the substrate 108 to be coupled/bonded to an independently fabricated III-V semiconductor material structure 102, as described in relation to FIGS. 2C-D.

Figure 2C:
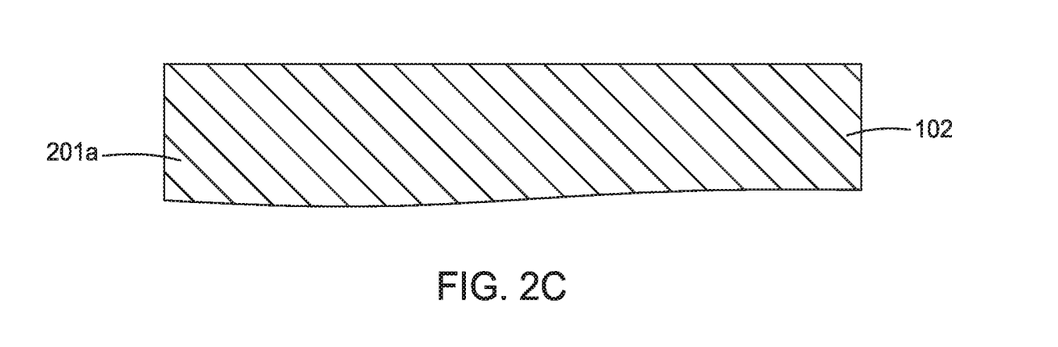
Figure 2D:
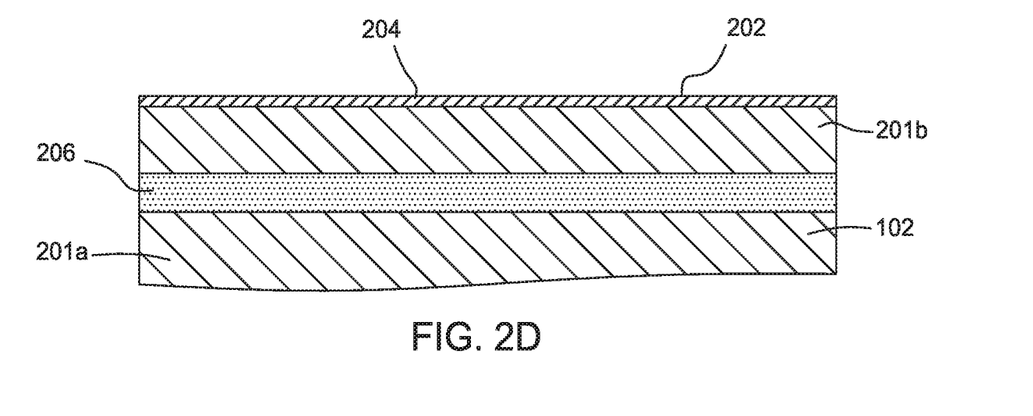

FIGS. 2C-D also shows an independent first state of fabrication for the laser platform 100. As described above, the III-V semiconductor material is fabricated/grown independently from the substrate 108, where a first portion 201a of the III-V semiconductor material structure 102 is formed/provided, as shown in FIG. 2C. In some examples, the first portion 201a is formed using epitaxial growth of a III-V semiconductor material and includes a low defect density and a Root Mean Square (RMS) roughness of approximately one nanometer or less. Once the first portion 201a is formed, the forming of the active layer 106 begins with the epitaxial growth of the quantum confined structures 206, as shown in FIG. 2D. In some examples, the structures 206 include QWs to form a QW laser. In another example, the structures 206 include QDs to form a QD laser. In some examples, the III-V semiconductor material structure 102 is a bulk substrate of a second wafer, wafer 304 shown in FIG. 3A. As shown in FIG. 3A, the wafer 304 includes the quantum confined structures 206. In some examples, the III-V material structure 102 may also be processed to incorporate one or more waveguides into the structure 102.

As also shown in FIG. 2D, a second portion 201b of the III-V semiconductor material structure 102 is provided in order to complete the structure 102. The structure 102 includes an upper surface 202. In some examples, a bonding layer 204 is a formed on the upper surface 202. In some examples, the bonding layer 204 includes a doped bonding surface, where the bonding surface is doped prior to the bonding and assists/provides an ohmic contact post bonding. In some examples, the doped bonding layer 203, shown in FIG. 2B, and the doped bonding layer 204 provide a conductive bonding between the silicon substrate 108 and the III-V semiconductor material structure 102. In another example, the metallic and/or degenerately doped bonding layer 203 provides the conductive bonding between the substrate 108 and the structure 102. In some examples, the bond between the substrate 108 and the structure 102 is classified as a low thermal impedance bond.

Low thermal impedance bonds in the laser platform 100 and a low thermal impedance substrate allow the active temperature of the laser to be much lower than alternative high impedance laser platforms. In some examples, lower temperatures in the functioning of the laser result in a higher optical power/output and a longer lifetime of the laser platform. In some embodiments, when a large area of the substrate 108 is used to interface the entire structure of the laser platform 100 and/or the PIC with a heat sink, the thermal path from the active layers of the laser and that heat sink may be approximately 10 Kelvins/Watt per mm. After the bonding layer 203 and the bonding layer 204 are formed on the substrate 108 and the structure 102 respectively, the components are ready for bonding as shown in FIG. 2E.

Figure 2E:
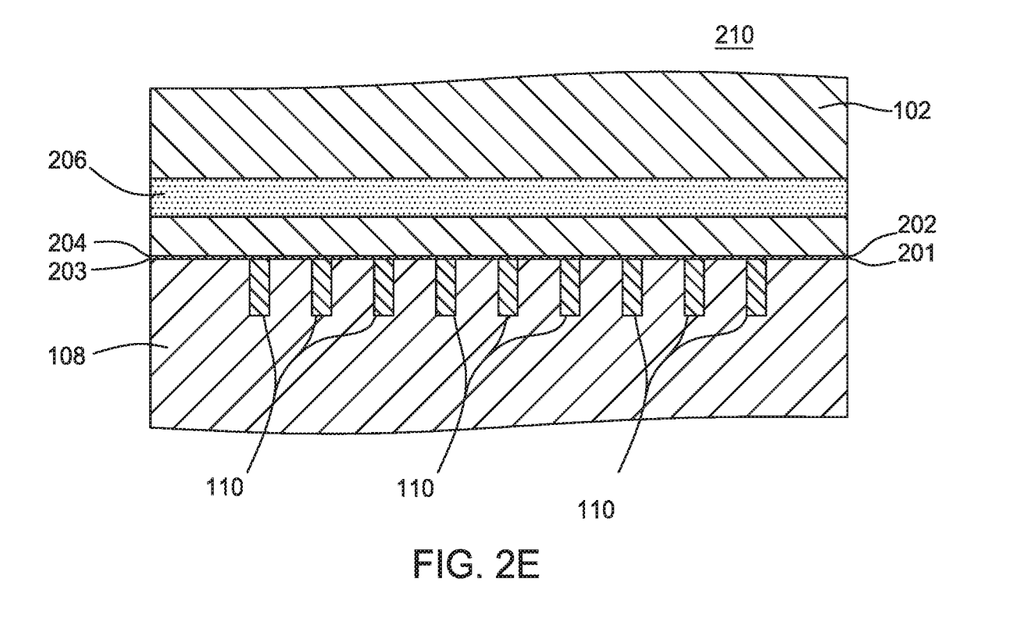
Figure 3B:
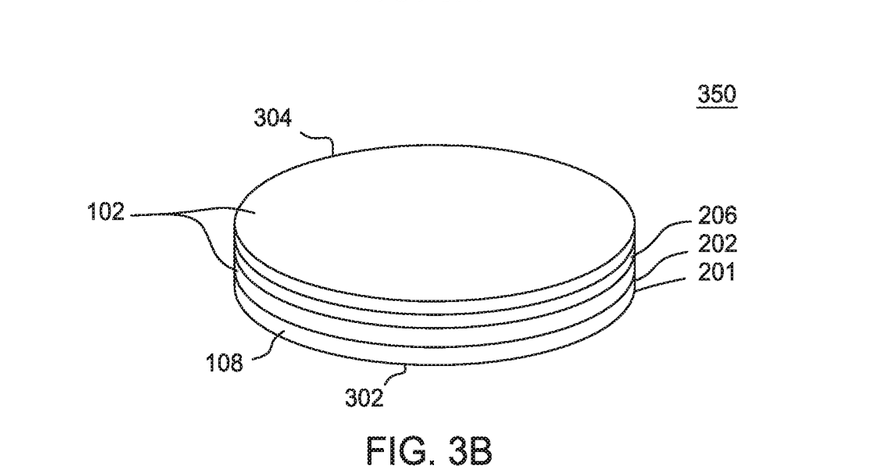

FIG. 2E illustrates the upper surface 202 bonded to the upper surface 201 forming the intermediate structure 210. In some examples, the bonding process may include anodic bonding, O2 plasma activated bonding, and/or other Van der Waal bonds in either an ambient environment or a vacuum environment. FIG. 3B is an example of the upper surface 202 bonded to the upper surface 201 at a wafer level, that is the bonding of the second wafer 304 to the first wafer 302, forming the intermediate (pre-processed) wafer 350 used as a base for the laser platforms described herein. The upper surface 202 may be bonded to the upper surface 201 using a low temperature bonding processes including a plasma assisted bonding, oxide free van der Waals bonding (e.g., with pressure under vacuum to remove native oxide), adhesive bonding, etc.

Figure 2F:
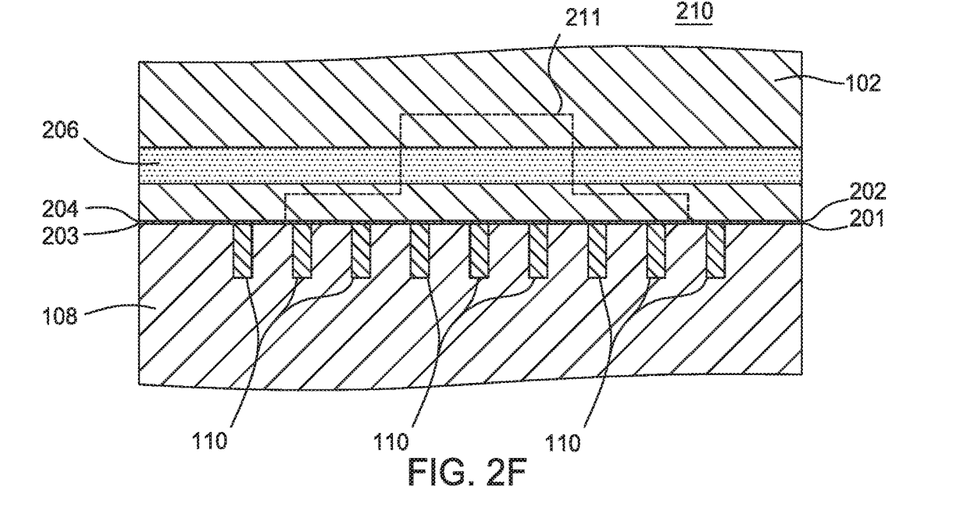
Figure 2G:
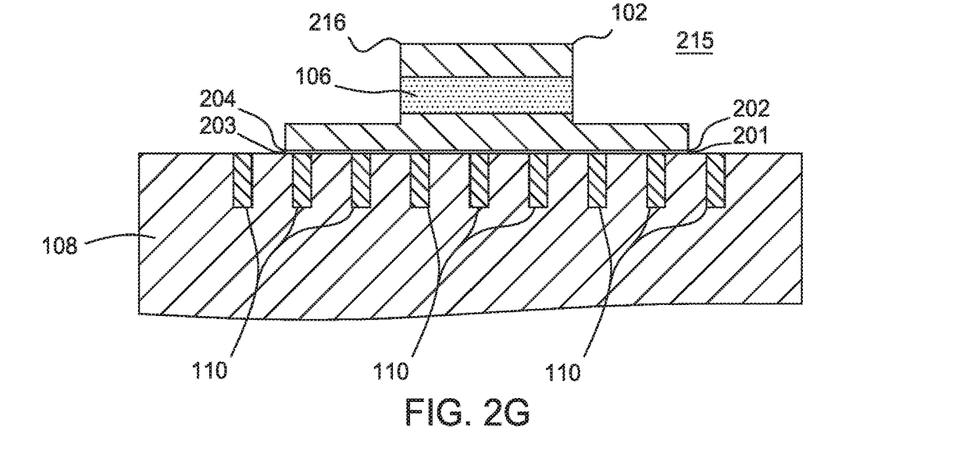

Once the intermediate structure 210 is bonded together, a form 211 is defined in the structure 210 as shown in FIG. 2F. In some examples, the form 211 is a form for the structure 102 in the completed laser platform 100, as shown in FIG. 1. In FIG. 2G, the form 211 is used to etch the structure 102 such that it takes the shape of the structure 216. The etching of the structure 102 can include a chemical and/or mechanical etching process.

Figure 2H:
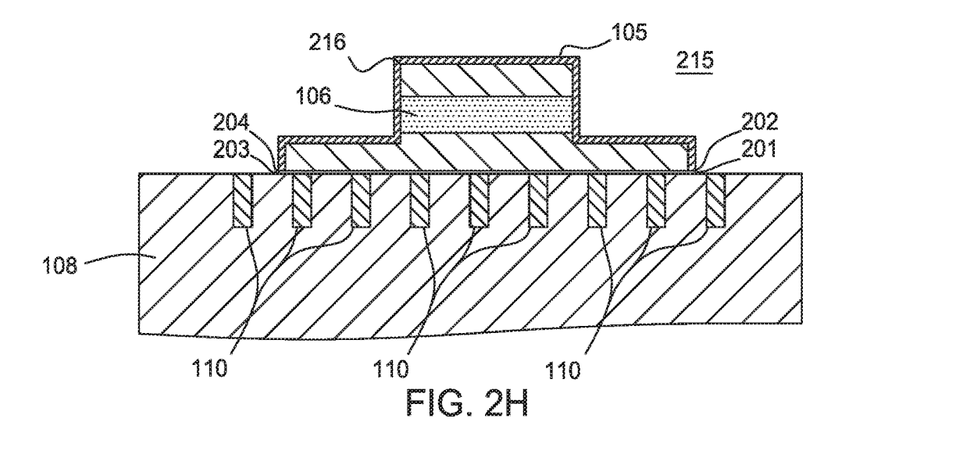
Figure 2I:
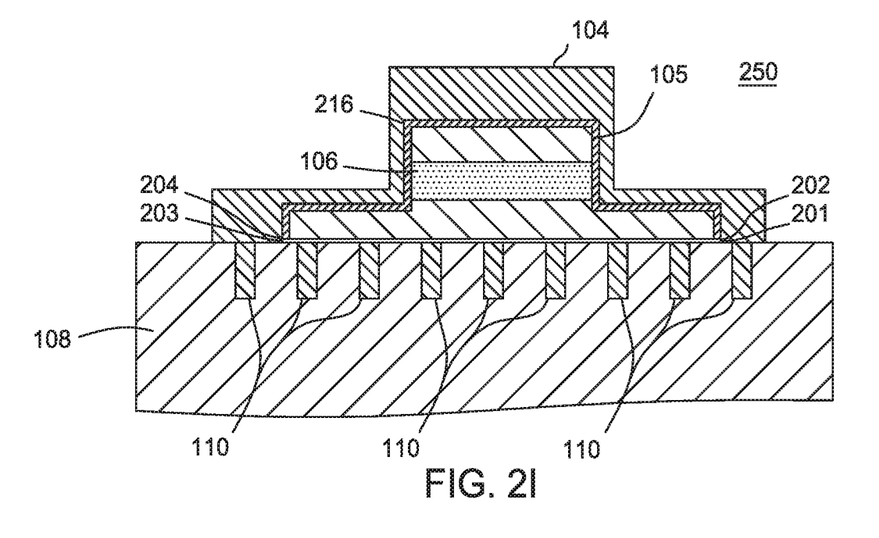
Figure 2J:
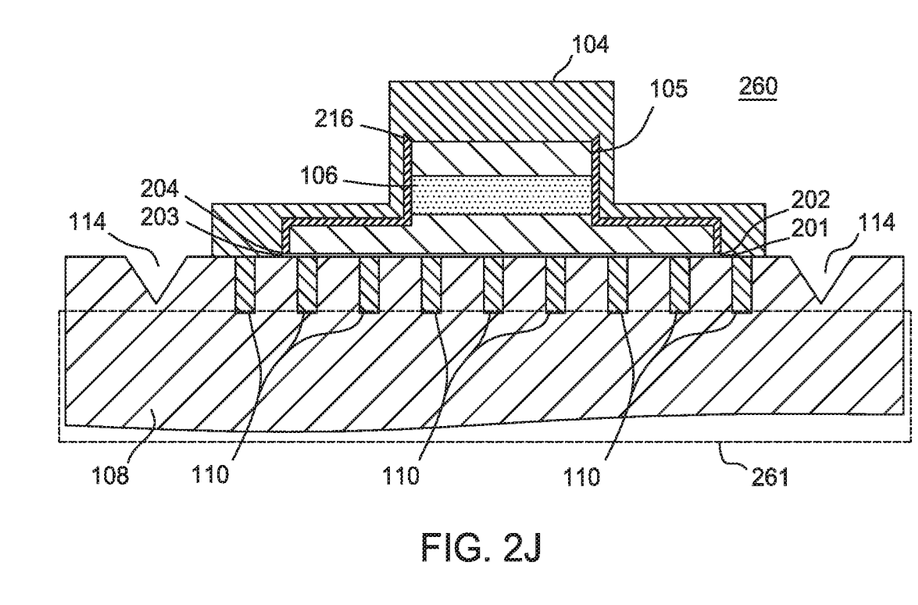

Once the structure 102 is etched into the structure 216, the structure 216 is covered with the passivation/isolation boundary 105 to protect the structure 102 and to provide isolation/insulation between the structure 102 and the other components of the laser platform 100. For example, the passivation/isolation boundary 105 may include a dielectric layer such as Silicon Nitride or Silicon dioxide layer, where the boundary 105 is evaporated onto the surface of the structure 102 and patterned to open a P-ridge. In FIG. 2I, the metal layer 220 is added in a metallization process. In FIG. 2J, the mechanical features 114 are formed in the substrate 108 though lithographic and/or mechanical grinding/etching. In some examples, the mechanical features 114 are formed in relation to the bonded structure 102, such that when the laser platform 100 is bonded with a PIC, the laser can be precisely aligned with the PIC components.

Figure 2K:
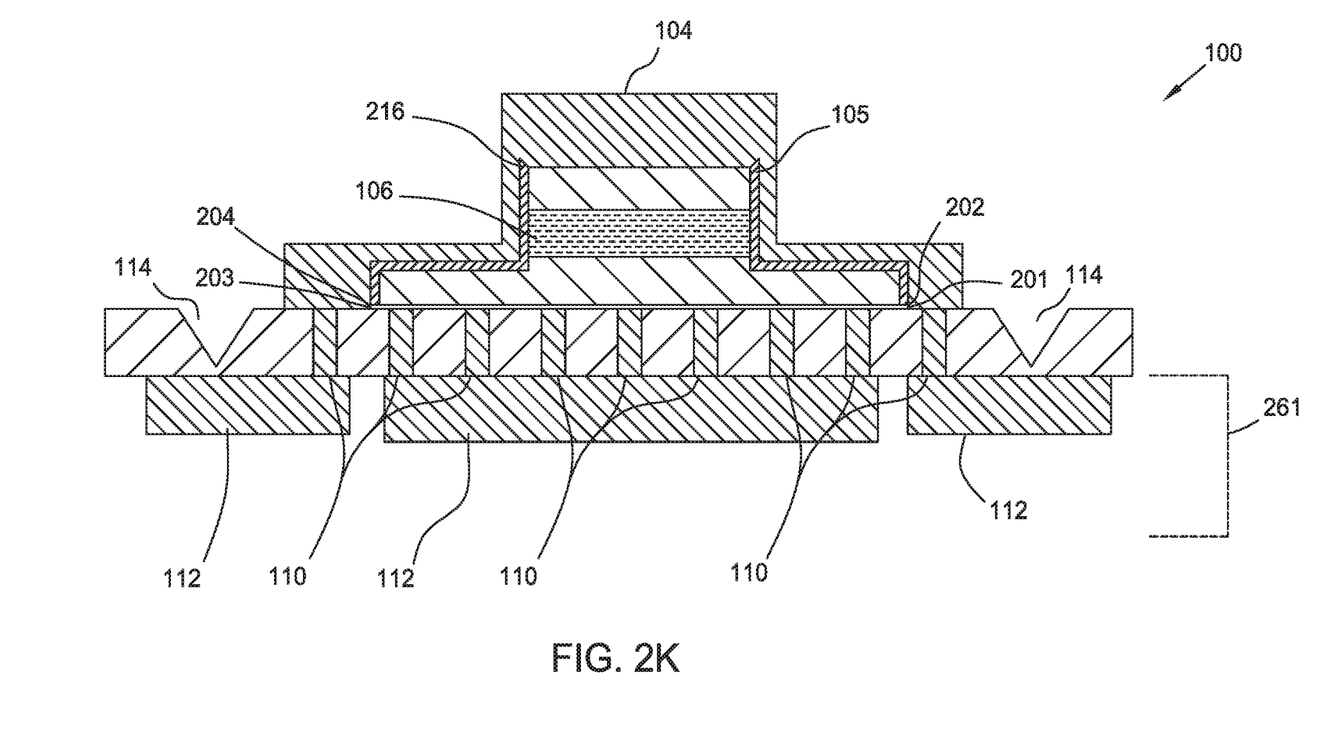
Figure 3C:
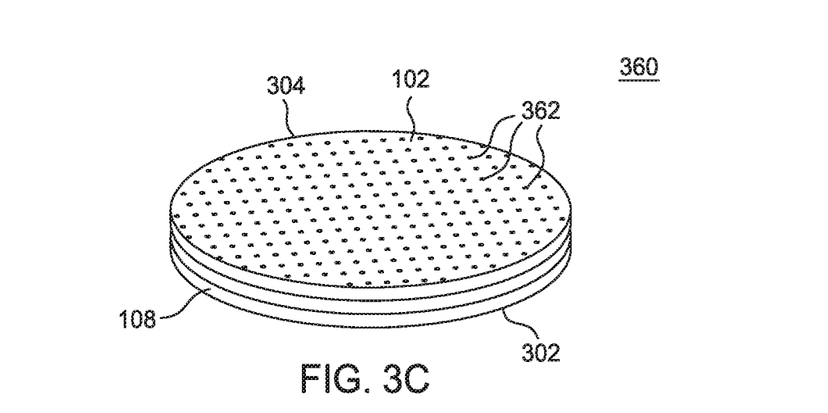

Furthermore, in some examples the structure 216 is defined in the substrate 108 and the substrate is thinned by removing the structure 216 from the substrate FIG. 3C is an example of a processed wafer 360 where a bonded structure such as the processed wafer 360 includes the individual dies of formed laser platforms 362 (e.g., laser platform 100), prior to dicing of the wafer. Additional metallization processes complete backside metal layers 112 to form the laser platform 100 as shown in FIG. 2K. In some examples, additional photonic elements such as waveguides etc., may also be added to the formed laser platform 100. In some examples, the completed laser platform can be tested at a wafer level to determine function and quality of individual laser platforms in the wafer. Example tests include, but are not limited to: device burn-in, wavelength characterization, light-current-voltage characterization, threshold measurements, wafer maps, photoluminescence, process monitoring, physical dimensions, etc. Once a wafer is diced, the functioning lasers may then be coupled to a PIC. While the fabrication steps are described in detailed terms in relation to FIGS. 2A-2K, the fabrication of the laser platform 100 may also be described in more general terms such as described in relation to FIG. 4.

Figure 4:
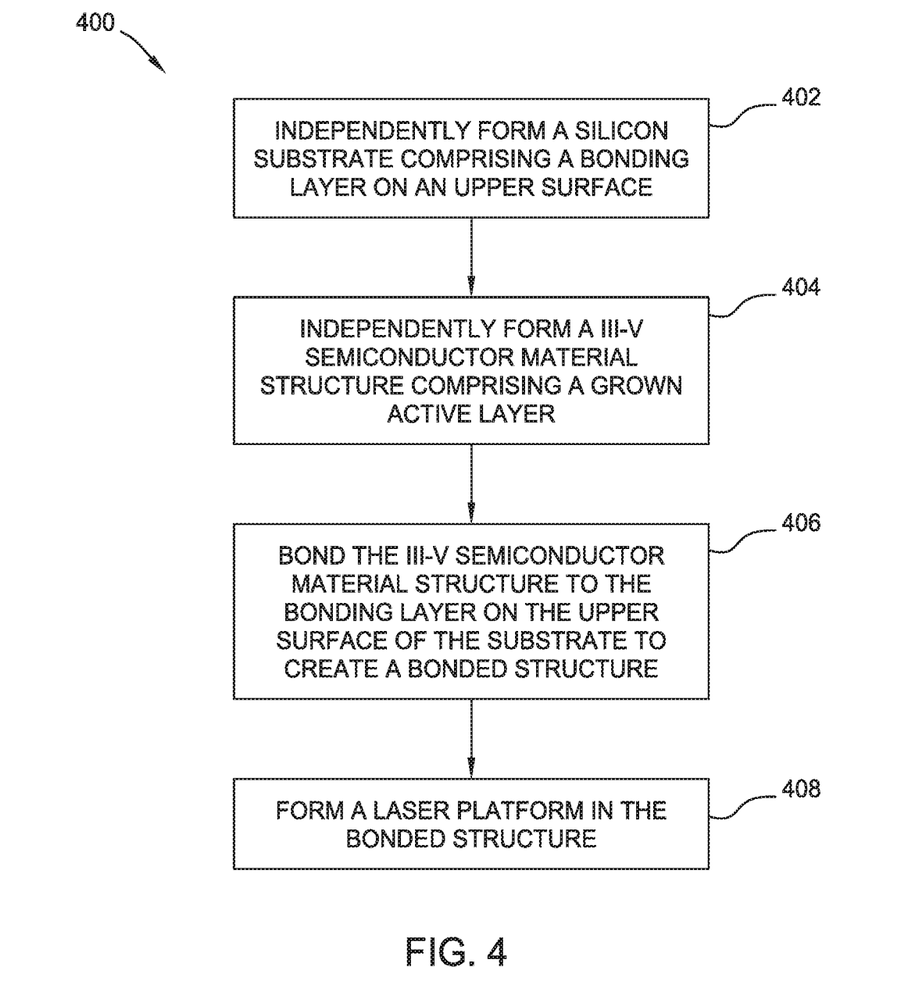
FIG. 4 is a flow chart outlining general operations in an example method to produce the a laser platform according to embodiments described herein.

FIG. 4 is a flow chart outlining general operations in an example method to produce the a laser platform according to embodiments described herein. Reference will be made to previous Figs. as described above. Method 400 begins with operation 402, where a silicon substrate comprising a bonding layer on an upper surface is independently formed, such as described in relation to FIGS. 2A and 2B. In some examples, the silicon substrate includes one or more TSVs formed in the substrate, as shown in FIG. 2B. In some examples, the bonding layer is formed such that it provides a conductive bonding between the silicon substrate and the III-V semiconductor material structure.

Method 400 proceeds to operation 404, where a III-V semiconductor material structure including a grown active layer is independently formed, such as is described in relation to FIGS. 2C and 2D. In some examples, the independent formation of the III-V semiconductor material structure requires high heat and other processing conditions that would damage components of the silicon substrate formed in operation 402. The independent formation of the substrate and the structure allows for properties, such as the TSVs to be formed and/or deposited on the substrate without damage from the III-V growth processes.

At operation 406, the III-V semiconductor material structure is bonded to the bonding layer on the upper surface of the substrate to create a bonded structure, as described above in relation FIG. 2E.

At operation 408, a laser platform is formed in the bonded structure, such as described in relation to FIGS. 2F-K. The formation process include at least removing excess III-V semiconductor material structure using an etching process to form the structure 216 described in FIGS. 2F and 2G. Additionally, passivation and/or isolation processes can be applied to the structure 216 to apply the boundary 105 as described in relation to FIG. 2H. In some examples, additionally TSVs may be formed in the substrate 108 described in relation the FIG. 2I using metallization processes that also deposit metal layers 104 and 112 described in relation to FIGS. 2I and 2K. Additionally, a plurality of mechanical features 114, as well as photonic elements such as waveguides etc., may be formed in the substrate of the bonded structure, such as the structure 260 as described in relation to FIG. 2J.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A bonded structure comprising:
    a first wafer comprising a silicon substrate, the silicon substrate comprising an upper surface and one or more through silicon vias (TSVs) defined through the silicon substrate, wherein the upper surface comprises a doped surface; and
    a second wafer comprising a III-V semiconductor material structure, wherein the second wafer comprises a bonding surface, wherein the bonding surface is bonded to the upper surface of the silicon substrate, wherein the bonding surface provides a conductive bonding between the silicon substrate and the III-V semiconductor material structure, wherein the III-V semiconductor material structure comprises at least one active layer forming a light source.

2. The bonded structure of claim 1, wherein the at least one active layer comprises a plurality of quantum wells.

3. The bonded structure of claim 1, wherein the at least one active layer comprises a plurality of quantum dots.

4. The bonded structure of claim 1, wherein the upper surface of the silicon substrate comprises a deposited metallic bonding surface enabling conductive bonding between the silicon substrate and the III-V semiconductor material structure.

5. The bonded structure of claim 1, wherein the bonding surface comprises a degenerately doped bonding surface, wherein the degenerately doped bonding surface provides the conductive bonding between the silicon substrate and the III-V semiconductor material structure.

6. The bonded structure of claim 1, wherein the bonding surface comprises a doped bonding surface, wherein the doped upper surface and the doped bonding surface provide the conductive bonding between the silicon substrate and the III-V semiconductor material structure.

7. The bonded structure of claim 1, wherein a bond between the second wafer and the upper surface of the silicon substrate is a low thermal impedance bond.

8. The bonded structure of claim 1, wherein the silicon substrate further comprises one or more TSVs, formed after the second wafer is bonded to the upper surface of the silicon substrate, and one or more mechanical features defined in the silicon substrate.

9. The bonded structure of claim 1, wherein the bonded structure comprises a plurality of individual laser dies.

10. A photonic platform comprising:
    a first wafer comprising a silicon substrate, the silicon substrate comprising an upper surface, one or more through silicon vias (TSVs) defined through the silicon substrate, wherein the upper surface comprises a doped surface, and passive alignment features in the silicon substrate for mating the photonic platform to a photonics integrated circuit; and
    a second wafer comprising a III-V semiconductor material structure, wherein the second wafer comprises a bonding surface, wherein the bonding surface is bonded to the upper surface of the silicon substrate, wherein the bonding surface provides a conductive bonding between the silicon substrate and the III-V semiconductor material structure, wherein the III-V semiconductor material structure comprises at least one active layer forming a light source for the photonic platform.

11. The photonic platform of claim 10, wherein the at least one active layer comprises a plurality of quantum wells.

12. The photonic platform of claim 10, wherein the at least one active layer comprises a plurality of quantum dots.

13. The photonic platform of claim 10, wherein the upper surface of the silicon substrate comprises a deposited metallic bonding surface enabling conductive bonding between the silicon substrate and the III-V semiconductor material structure.

14. The photonic platform of claim 10, wherein the bonding surface comprises a degenerately doped bonding surface, wherein the degenerately doped bonding surface provides the conductive bonding between the silicon substrate and the III-V semiconductor material structure.

15. The photonic platform of claim 10, wherein the bonding surface comprises a doped bonding surface, wherein the doped upper surface and the doped bonding surface provide the conductive bonding between the silicon substrate and the III-V semiconductor material structure.

16. The photonic platform of claim 10, wherein a bond between the second wafer and the upper surface of the silicon substrate is a low thermal impedance bond.

* * * * *